United States Patent
Marty et al.

(10) Patent No.: US 7,115,465 B2
(45) Date of Patent: Oct. 3, 2006

(54) METHOD FOR MANUFACTURING A BIPOLAR TRANSISTOR

(75) Inventors: Michel Marty, Saint Paul de Varces (FR); Bertrand Martinet, Grenoble (FR); Cyril Fellous, Echirolles (FR)

(73) Assignee: STMicroelectronics, S.A., Montrouge (FR)

(*) Notice: Subject to any disclaimer, the term of this patent is extended or adjusted under 35 U.S.C. 154(b) by 0 days.

(21) Appl. No.: 10/838,860

(22) Filed: May 3, 2004

(65) Prior Publication Data

US 2005/0037586 A1    Feb. 17, 2005

(30) Foreign Application Priority Data

May 2, 2003    (FR)    ................... 03 05419

(51) Int. Cl.
*H01L 21/8249* (2006.01)
(52) U.S. Cl. .............. 438/234; 438/235; 438/309; 438/E21.608
(58) Field of Classification Search .............. None
See application file for complete search history.

(56) References Cited

U.S. PATENT DOCUMENTS

| | | | |
|---|---|---|---|
| 4,735,916 A | 4/1988 | Homma et al. | |
| 6,756,604 B1 * | 6/2004 | Kovacic et al. | 257/19 |
| 6,821,870 B1 * | 11/2004 | Takagi et al. | 438/564 |
| 6,927,118 B1 * | 8/2005 | Idota et al. | 438/235 |
| 6,949,764 B1 * | 9/2005 | Ning | 257/47 |
| 2002/0052074 A1 | 5/2002 | Lafontaine et al. | |

FOREIGN PATENT DOCUMENTS

EP    1 065 728 A2    1/2001

OTHER PUBLICATIONS

European Search Report for EP 04 30 0255, Jan. 5, 2005.
French Search Report for FR 0305419 dated Jan. 22, 2004.
Tzu-Yin Chiu et al.; "Monoverlapping Super Self-Aligned Device Structure for High-Performance VLSI", IEEE Electron Device Letters, IEEE Inc., New York, U.S. vol. 11, No. 2, Feb. 1, 1990, pp. 85-87.

* cited by examiner

*Primary Examiner*—Dung A. Le
(74) *Attorney, Agent, or Firm*—Lisa K. Jorgenson; J. Mark Han; Graybeal Jackson Haley, LLP

(57) ABSTRACT

A method for manufacturing a bipolar transistor, comprising the steps of:
growing on the substrate a first semiconductor; depositing an encapsulation layer etchable with respect to the first semiconductor, forming a sacrificial block at the location of the base-emitter junction; exposing the first semiconductor around spacers formed around said block; forming a second semiconductor, then a third semiconductor etchable with respect to the second semiconductor layer, the encapsulation layer, and the spacers, the sum of the thicknesses of the second semiconductor and the sacrificial layer being substantially equal to the sum of the thicknesses of the encapsulation layer and of the sacrificial block; removing the block and the encapsulation layer; depositing a fourth semiconductor; removing the third semiconductor; and etching an insulating layer to maintain it on the emitter walls and between said emitter and the second semiconductor.

18 Claims, 2 Drawing Sheets

METHOD FOR MANUFACTURING A BIPOLAR TRANSISTOR

PRIORITY CLAIM

Figure 1:
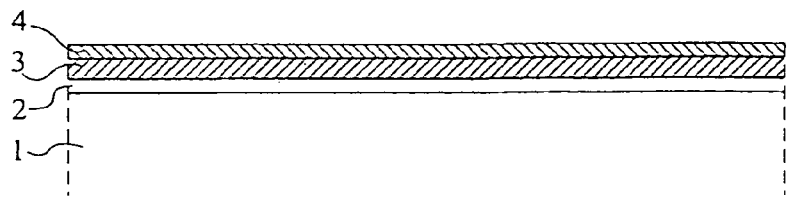

This application claims priority from French patent application No. 03/05419, filed May 2, 2003, which is incorporated herein by reference.

BACKGROUND OF THE INVENTION

1. Field of the Invention

The present invention relates generally to the manufacturing of bipolar transistors in integrated circuits. More specifically, the present invention relates to the forming of a base-emitter structure of a bipolar transistor.

2. Discussion of the Related Art

To optimize the electrical performances of a bipolar transistor, it is desirable for the doping and the thickness of its intermediary base region between its collector and its emitter to be controlled as accurately as possible.

SUMMARY OF THE INVENTION

An embodiment of the present invention enables obtaining bipolar transistors with better performances than those of existing bipolar transistors.

Another embodiment of the present invention enables accurately defining the alignment of the base and the emitter.

Another embodiment of the present invention enables defining a very thin base.

Another embodiment of the present invention provides a method for manufacturing a bipolar transistor in a single-crystal substrate of a first conductivity type, comprising the steps of:

growing on the substrate at least one first semiconductor layer of the second conductivity type;

depositing at least one encapsulation layer selectively etchable with respect to the underlying semiconductor layer;

forming a sacrificial block at the location where the base-emitter junction of the transistor is to be formed;

forming lateral spacers around the block;

exposing the first semiconductor layer around the block on either side of the lateral spacers;

growing by selective epitaxy a second heavily-doped semiconductor layer of the second conductivity type;

growing by selective epitaxy a third semiconductor layer selectively etchable with respect to the second semiconductor layer, with respect to the encapsulation layer and with respect to the lateral spacers, the sum of the thicknesses of the second semiconductor layer and of the sacrificial layer being substantially equal to the sum of the thicknesses of the encapsulation layer and of the sacrificial block;

selectively removing the block and the underlying encapsulation layer to expose the first semiconductor layer;

depositing and etching a fourth heavily-doped semiconductor layer of the first conductivity type;

removing the third semiconductor layer; and depositing and anisotropically etching an insulating layer to maintain it in place on the lateral walls of the emitter and between said emitter and the second semiconductor layer.

According to an embodiment of the present invention, the encapsulation layer is a silicon oxide layer.

According to an embodiment of the present invention, the sacrificial block is formed by depositing and etching a silicon oxide layer.

According to an embodiment of the present invention, the lateral spacer forming step comprises the steps of:

depositing at least one additional encapsulation layer selectively etchable with respect to said encapsulation layer resting on the first semiconductor layer of the second conductivity type;

anisotropically etching the planar portions of the additional encapsulation layer to expose the upper surfaces of the encapsulation layer and of the sacrificial block; and anisotropically etching the encapsulation layer to expose the first semiconductor layer.

According to an embodiment of the present invention, the second and third encapsulation layers are made of silicon nitride.

According to an embodiment of the present invention, the second semiconductor layer is a silicon layer of a thickness between 30 and 70 nm.

According to an embodiment of the present invention, the third semiconductor layer is a silicon-germanium layer of a thickness between 30 and 70 nm.

According to an embodiment of the present invention, the conductive layer is a heavily-doped silicon layer of the first conductivity type.

According to an embodiment of the present invention, the insulating layer is a silicon oxide layer.

According to an embodiment of the present invention, the first semiconductor layer is a silicon-germanium layer formed by epitaxy so that it is formed of at least the four following superposed areas:

a silicon-germanium area comprising carbon;

a silicon-germanium area comprising carbon and dopants of the desired second conductivity type;

a silicon-germanium area comprising carbon; and a silicon area.

Features and advantages of the present invention will be discussed in detail in the following non-limiting description of specific embodiments in connection with FIGS. 1 to 10, which illustrate, in partial simplified cross-section view, successive steps of a method for manufacturing a bipolar transistor according to an embodiment of the present invention.

DETAILED DESCRIPTION

For clarity, as usual in the representation of integrated circuits, the cross-section views are not drawn to scale. Further, same elements are designated with same reference numerals in the different drawings. Further, along with their identifications, the different elements (base, collector . . . ) of a bipolar transistor will be designated with the reference of the layer or of the material forming them.

An embodiment of the present invention, applied to the forming of an NPN-type bipolar transistor, is described hereafter in relation with FIGS. 1 to 10.

As illustrated in FIG. 1, the method starts from a doped single-crystal semiconductor substrate 1 of a first conductivity type, for example, N, intended to form the collector of the bipolar transistor. On substrate 1, a doped single-crystal semiconductor layer Z preferably of second conductivity type P, intended to form the transistor base, is formed by epitaxy. Since base layer 2 results from an epitaxy, its thickness and its doping level are typically accurately determined.

Then, at least one encapsulation layer, for example, two layers 3 and 4, is (are) deposited. Lower layer 3 is selectively etchable with respect to the semiconductor forming underlying layer 2. Upper layer 4 is selectively etchable with respect to lower layer 3.

Figure 2:
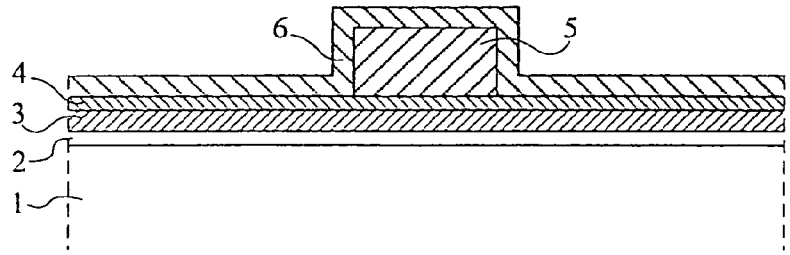

At the next steps, illustrated in FIG. 2, a sacrificial block 5 is formed at the location where the emitter of the bipolar transistor is desired to be formed. Block 5 is obtained by depositing, then etching, a material selectively etchable with respect to encapsulation layer 4.

Then, the entire structure, that is, block 5 and encapsulation layer 4 on either side thereof, is covered with an encapsulation layer 6. Preferably, layer 6 is made of a same material as layer 4.

Figure 3:
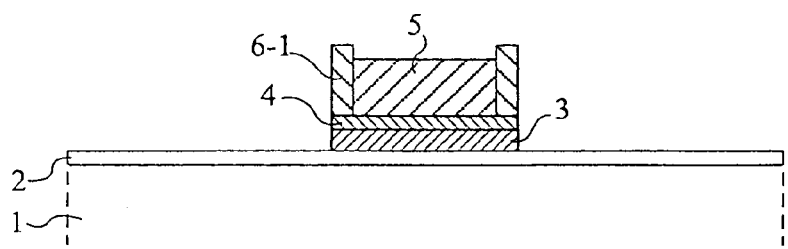

At the next steps, illustrated in FIG. 3, anisotropic, selective successive etchings of layers 6 and 4 are performed to only leave in place spacers 6-1 along the lateral walls of block 5. Then, layer 3 is etched to expose base layer 2. Layer 3 is maintained in place only under the remaining portion of layer 4. If block 5 is made of a same material as layer 3, an upper part of block 5 is then removed, as shown.

Figure 4:
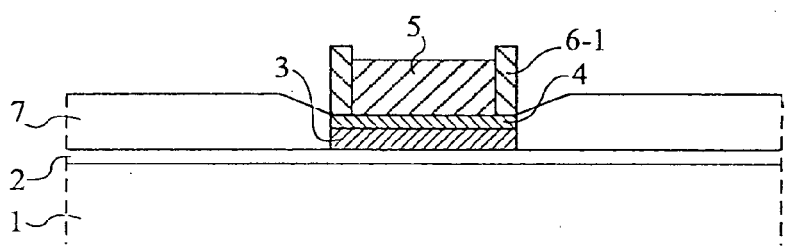

At the next steps, illustrated in FIG. 4, an epitaxial growth of a semiconductor layer 7 is carried out. The growth conditions are selected so that no deposition occurs elsewhere than on the exposed semiconductor portions, that is, only the exposed portions of layer 2. Very heavily-doped P-type layer 7 is intended to form a base contact.

Figure 5:
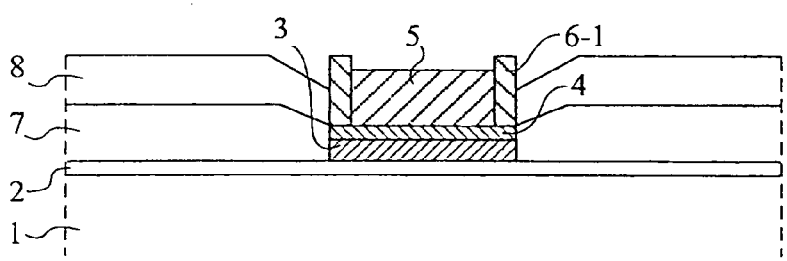

Finally, as illustrated in FIG. 5, a new selective epiaxial deposition is performed to form a sacrificial layer 8 only on layer 7. Layer 8 is made of a material selectively etchable with respect to that of base contact layer 7. The thickness of layer 8 is selected according to the thickness of layer 7 so that the upper surface of layer 8 is substantially coplanar to the upper surface of block 5.

Figure 6:
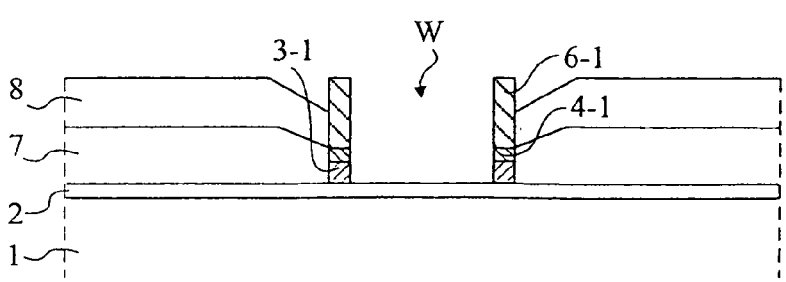

At the next steps, illustrated in FIG. 6, sacrificial block 5 is removed by selective etch. The portion of layer 4 thus exposed and the underlying portion of layer 3 are selectively etched. Intrinsic base 2 is thus partially exposed at the bottom of a window W defined by lateral spacers 6-1 and the remaining portions 41 and 3-1 of layers 4 and 3 arranged under spacers 6-1.

Figure 7:
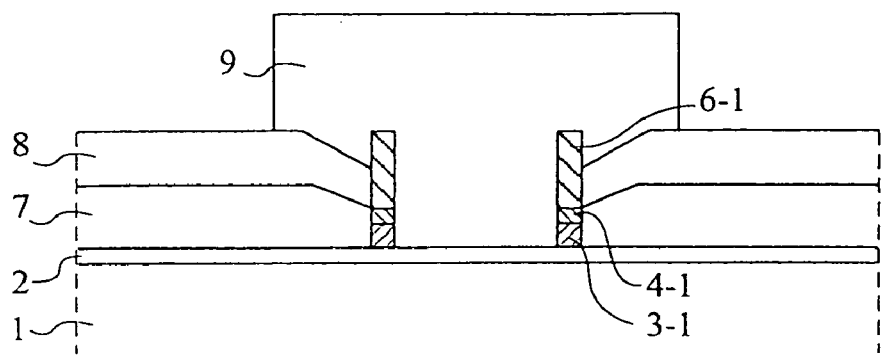

Then, as illustrated in FIG. 7, a layer 9 of a semiconductor material is deposited. Heavily-doped N-type layer 9 is intended to form the emitter of the bipolar transistor. Layer 9 is then etched to remain in place in window W. Inevitably, layer 9 overflows above sacrificial layer 8 outside of spacers 6-1. The material of sacrificial layer 8 is selected to be selectively etchable with respect to the semiconductor material of layer 9.

Figure 8:
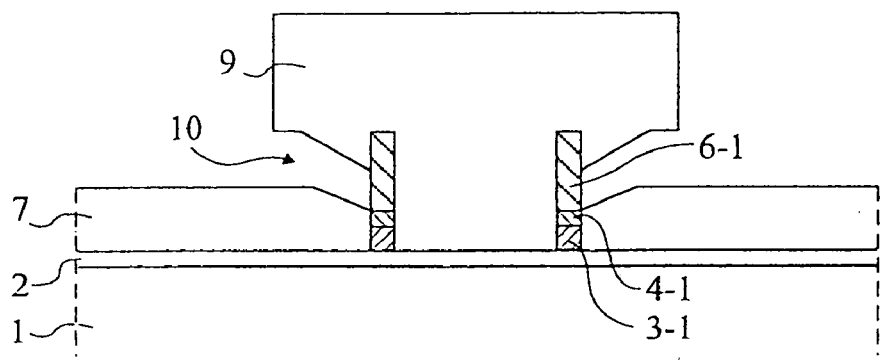

At the step illustrated in FIG. 8, sacrificial layer 8 is totally and selectively etched, which leaves a void 10 between emitter 9 and base contact 7. Void 10 avoids any short-circuit between emitter 9 and base contact 7.

Figure 9:
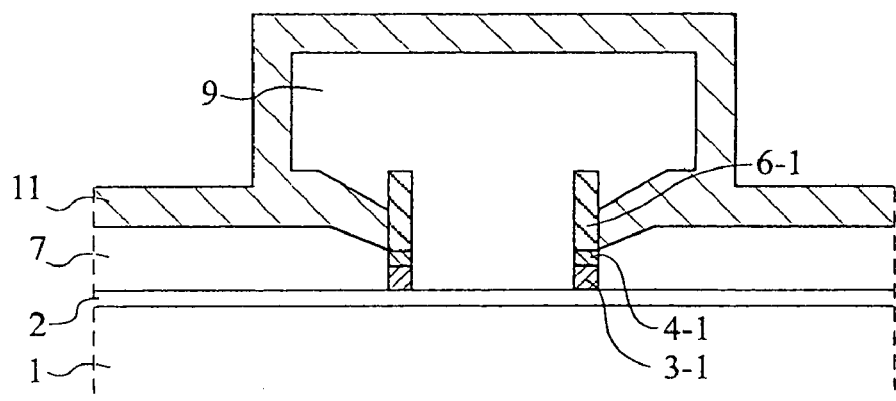

At the next steps, illustrated in FIG. 9, an insulating layer 11 is deposited. Layer 11 is deposited to fill void 10 and cover the entire structure.

Figure 10:
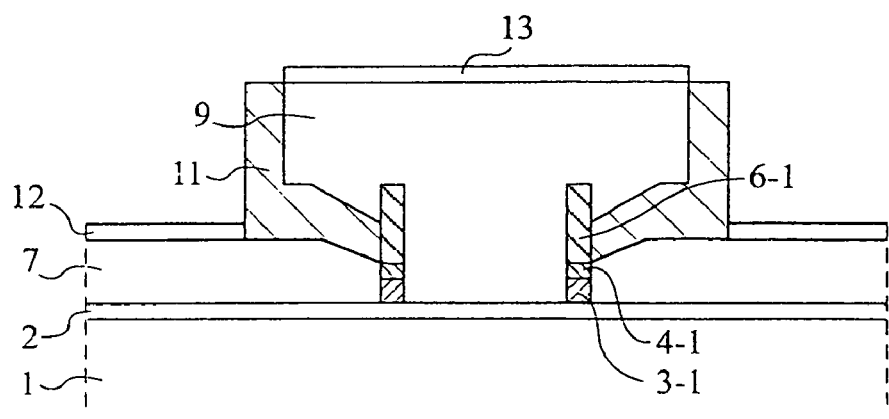

As illustrated in FIG. 10, layer 11 is anisotropically etched to expose the upper surface of emitter 9 and the upper surface of base contact layer 7. The portions of layer 11 remaining after etching fill void 10 and cover the lateral walls of emitter 9. An insulation of emitter 9 from base contact 7 is thus ensured.

A step is then preferably carried out where heavily-conductive layers are formed: a layer 12 on base contact layer 7 and a layer 13 on emitter layer 9. For example, in standard processes based on silicon, a silicidation will be carried out to form layers 12 and 13 of a metal silicide.

The method then continues with conventional steps of the forming of a bipolar transistor such as, for example, the forming of metallizations (not shown) solid with these surfaces. . . .

As should be understood by those skilled in the art, only those steps necessary to the understanding of the present invention have been described hereabove. It will be within the abilities of those skilled in the art to complete the previously-described method to form a bipolar transistor. In particular, the collector structure has not been described herein. It may conventionally comprise a heavily-doped N-type buried region topped with an also heavily-doped N-type deep implantation region. To preserve the quality of base layer 2, the deep implantation may be performed before its growth described in relation with FIG. 1.

As a non-limiting example, the materials and thicknesses of the different layers and elements used to form an NPN-type bipolar transistor according to an embodiment of the present invention are the following:

substrate 1: N-type doped silicon;

base layer 2: silicon or silicon-germanium SiGe, or silicon and silicon-germanium SiGe multilayer, of a total thickness from 10 to 100 nm, for example, 50 nm. Preferably, the epitaxial growth of base layer 2 is carried out so that it is formed of four superposed areas:

a first SiGe area, supported by substrate 1 and comprising carbon (C);

a second SiGe area, with a germanium proportion from 0 to 50%, comprising carbon and dopants likely to give it the desired conductivity type, for example, boron atoms (B) at an active concentration ranging between $5.10^{18}$ and $10^{21}$ atoms/cm$^3$;

a third SiGe area, comprising carbon;

a fourth silicon area.

The carbon is incorporated in the different areas so that they remain conductive;

first encapsulation layer 3: silicon oxide ($SiO_2$), of a thickness ranging between 5 and 20 nm;

second encapsulation layer 4: silicon nitride ($Si_3N_4$), of a thickness ranging between 10 and 20 nm;

sacrificial block 5: silicon oxide, of a thickness ranging between 80 and 150 nm, for example, 100 nm;

encapsulation layer 6: silicon nitride, of a thickness ranging between 50 and 100 nm;

base contact layer 7: silicon, of a thickness ranging between 30 and 70 nm, for example, 50 nm, P-type doped, for example with boron at a concentration greater than $10^{20}$ atoms/cm$^3$;

sacrificial layer 8: silicon-germanium layer, of a thickness between 30 and 70 nm, for example, 50 nm. To set the etch selectivity between base contact layer 7 and layer 8, said layer may possibly be N- or P-type doped in situ on its epitaxial growth;

emitter layer 9: silicon, preferably N-type doped in situ;

insulating layer 11: silicon oxide.

Among the advantages of bipolar transistors according to this embodiment of the present invention, the following should be noted:

the use of the sacrificial block to define the emitter window enabling achieving very small dimensions, under 0.1 μm;

such dimensions are also achieved when the base is very thin, for example between 10 and 30 nm;

such dimensions of the window and/or of the base are achieved with a method enabling self-alignment of emitter 9 and of base contact 7 with respect to base 2, the lateral spacers 6-1 surrounding emitter area 9 result from a deposition of a thin silicon nitride layer 6 (that may have a thickness on the order of from 50 to 100 nm only, as seen previously). Base contact region 7 will then be very dose to intrinsic base region 2, whereby the extrinsic base region between these regions will have a minimum thickness, which reduces the resistance of access to the base;

a good insulation between emitter 9 and base contact region 7, which results from the removal of sacrificial layer 8. Short-circuit risks are then significantly reduced.

Of course, the present invention is likely to have various alterations, modifications, and improvements which will readily occur to those skilled in the art. In particular, the present invention has been considered hereabove in the case of the forming of an NPN-type bipolar transistor. However, the present invention also applies to the forming of PNP-type transistors. Further, it will be within the abilities of those skilled in the art to appropriately complete the previously-described structure to obtain a specific device. Only those steps and elements necessary to the understanding of the present invention have been described hereabove. Thus, it will be within the abilities of those skilled in the art to implement, before forming base 2 to obtain the structure of FIG. 1, conventional substrate processing steps intended to form specifically-doped, or specific insulation, layers or areas, necessary to the operation of the resulting transistor. Similarly, it will be within the abilities of those skilled in the art to adapt the natures and dimensions of the various layers of a specific technological process while respecting the previously-described etch and thickness rules.

Such alterations, modifications, and improvements are intended to be part of this disclosure, and are intended to be within the spirit and the scope of the present invention. Accordingly, the foregoing description is by way of example only and is not intended to be limiting.

What is claimed is:

1. A method for manufacturing a bipolar transistor in a single-crystal substrate of a first conductivity type, comprising the steps of:
   growing on the substrate at least one first semiconductor layer of the second conductivity type;
   depositing at least one encapsulation layer selectively etchable with respect to the underlying semiconductor layer;
   forming a sacrificial block at the location where the base-emitter junction of the transistor is to be formed;
   forming lateral spacers around the block;
   exposing the first semiconductor layer around the block on either side of the lateral spacers;
   growing by selective epitaxy a second heavily-doped semiconductor layer of the second conductivity type;
   growing by selective epitaxy a third semiconductor layer selectively etchable with respect to the second semiconductor layer, the encapsulation layer and the lateral spacers, the sum of the thicknesses of the second semiconductor layer and the sacrificial layer being substantially equal to the sum of the thicknesses of the encapsulation layer and the sacrificial block;
   selectively removing the block and the underlying encapsulation layer to expose the first semiconductor layer;
   depositing and etching a fourth heavily-doped semiconductor layer of the first conductivity type;
   removing the third semiconductor layer; and
   depositing and anisotropically etching an insulating layer to maintain it in place on the lateral walls of the emitter and between said emitter and the second semiconductor layer.

2. The method of claim 1, wherein the encapsulation layer is a silicon oxide layer.

3. The method of claim 1, wherein the sacrificial block is formed by depositing and etching a silicon oxide layer.

4. The method of claim 1, wherein the lateral spacer forming step comprises the steps of:
   depositing at least one additional encapsulation layer selectively etchable with respect to said encapsulation layer resting on the first semiconductor layer of the second conductivity type;
   anisotropically etching the planar portions of the additional encapsulation layer to expose the upper surfaces of the encapsulation layer and of the sacrificial block; and
   anisotropically etching the encapsulation layer to expose the first semiconductor layer.

5. The method of claim 4, wherein two additional silicon nitride encapsulation layers are successively deposited and etched.

6. The method of claim 1, wherein the second semiconductor layer is a silicon layer of a thickness between 30 and 70 nm.

7. The method of claim 1, wherein the third semiconductor layer is a silicon-germanium layer of a thickness between 30 and 70 nm.

8. The method of claim 1, wherein the fourth semiconductor layer is a heavily-doped silicon layer of the first conductivity type.

9. The method of claim 1, wherein the insulating layer is a silicon oxide layer.

10. The method of claim 1, wherein the first semiconductor layer is a silicon-germanium layer formed by epitaxy so that it is formed of at least the four following superposed areas:
    a silicon-germanium area comprising carbon;
    a silicon-germanium area comprising carbon and dopants of the desired second conductivity type;
    a silicon-germanium area comprising carbon; and
    a silicon area.

11. A method, comprising:
    forming on a collector having a first conductivity type a base having a second conductivity type;
    forming on the base an emitter window having a side;
    forming on the base outside of the emitter window a base contact contiguous with the side of the emitter window;
    forming on the base contact a sacrificial layer:
    forming on the base inside of the emitter window an emitter having the first conductivity type, wherein a portion of the emitter is formed outside of the emitter window and extends over the sacrificial layer;
    removing the sacrificial layer to leave a void beneath the portion of the emitter outside of the emitter window; and
    forming an insulator in the void.

12. The method of claim 11 wherein forming the base comprises:
    forming on the collector a first layer of silicon germanium including carbon;
    forming on the first layer a second layer of silicon germanium including carbon and a dopant of the first conductivity type;

forming on the second layer a third layer of silicon germanium including carbon; and forming on the third layer a fourth layer of silicon.

13. The method of claim 11 wherein forming the emitter window comprises:

forming on the base a sacrificial structure that includes an insulator side wall; and removing an interior portion of the sacrificial structure to form the emitter window from the side wall.

14. The method of claim 11 wherein forming the base contact comprises:

epitaxially growing the base contact on the base outside of the emitter window; and doping the base contact with a dopant of the second conductivity type.

15. The method of claim 11 wherein forming the emitter comprises:

forming a layer of semiconductor material within the emitter window; and doping the layer of semiconductor material with a dopant of the first conductivity type.

16. The method of claim 11, wherein forming the insulator comprises forming the insulator on the emitter and the base contact to electrically insulate the emitter from the base contact.

17. The method of claim 11, wherein the sacrificial layer comprises silicon-germanium.

18. The method of claim 11, wherein removing the sacrificial layer comprises selectively etching the sacrificial layer.

* * * * *